(12) United States Patent
Smits et al.

(10) Patent No.: US 7,352,011 B2
(45) Date of Patent: Apr. 1, 2008

(54) WIDE EMITTING LENS FOR LED USEFUL FOR BACKLIGHTING

(75) Inventors: Willem H. Smits, Veldhoven (NL); Robert F. M. Hendriks, Overlangel (NL); Grigoriy Basin, San Francisco, CA (US); Frans H. Konijn, Huizen (NL); Robert Scott West, Morgan Hill, CA (US); Paul S. Martin, Pleasanton, CA (US); Gerard Harbers, Sunnyvale, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 31 days.

(21) Appl. No.: 11/093,961

(22) Filed: Mar. 29, 2005

(65) Prior Publication Data

US 2006/0102914 A1    May 18, 2006

Related U.S. Application Data

(63) Continuation-in-part of application No. 11/069,418, filed on Feb. 28, 2005, which is a continuation-in-part of application No. 10/990,208, filed on Nov. 15, 2004.

(51) Int. Cl.
*H01L 29/22* (2006.01)
(52) U.S. Cl. .................. 257/99; 257/100; 257/E33.056; 257/E33.058; 257/E33.059
(58) Field of Classification Search ................. 362/326
See application file for complete search history.

(56) References Cited

U.S. PATENT DOCUMENTS

| | | | |
|---|---|---|---|
| 1,796,468 A | * | 3/1931 | Main ........................... 362/303 |
| 6,274,399 B1 | | 8/2001 | Kern et al. |
| 6,274,924 B1 | | 8/2001 | Carey et al. |
| 6,576,488 B2 | | 6/2003 | Collins, III et al. |
| 6,649,440 B1 | | 11/2003 | Krames et al. |
| 6,682,331 B1 | | 1/2004 | Peh et al. |
| 2001/0026011 A1 | | 10/2001 | Roberts et al. |
| 2002/0141006 A1 | | 10/2002 | Pocius et al. |
| 2003/0235050 A1 | * | 12/2003 | West et al. .................. 362/327 |
| 2004/0227149 A1 | | 11/2004 | Ibbetson et al. |
| 2005/0024744 A1 | * | 2/2005 | Falicoff et al. ............. 359/737 |
| 2005/0225988 A1 | * | 10/2005 | Chaves et al. .............. 362/332 |

OTHER PUBLICATIONS

"Side-Emitting Optic," Carclo Precision Optics data sheet, downloaded from www.carclo-optics.com, 2 pages.

* cited by examiner

*Primary Examiner*—B. William Baumeister
*Assistant Examiner*—Matthew L. Reames
(74) *Attorney, Agent, or Firm*—Patent Law Group LLP; Brian D. Ogonowsky

(57) ABSTRACT

Lenses and certain fabrication techniques are described. A wide-emitting lens refracts light emitted by an LED die to cause a peak intensity to occur within 50-80 degrees off the center axis and an intensity along the center axis to be between 5% and 33% of the peak intensity. The lens is particularly useful in a LCD backlighting application. In one embodiment, the lens is affixed to the backplane on which the LED die is mounted and surrounds the LED die. The lens has a hollow portion that forms an air gap between the LED die and the lens, where the light is bent towards the sides both at the air gap interface and the outer lens surface interface. The lens may be a secondary lens surrounding an interior lens molded directly over the LED die.

32 Claims, 12 Drawing Sheets

WIDE EMITTING LENS FOR LED USEFUL FOR BACKLIGHTING

CROSS-REFERENCE TO RELATED APPLICATIONS

This is a continuation-in-part (CIP) of U.S. application Ser. No. 11/069,418, filed Feb. 28, 2005, by Grigoriy Basin et al., entitled "Overmolded Lens Over LED Die," which is a CIP of U.S. application Ser. No. 10/990,208, filed Nov. 15, 2004, by Grigoriy Basin et al., entitled "Molded Lens Over LED Die."

FIELD OF THE INVENTION

This invention relates to light emitting diodes (LEDs) and, in particular, to certain lens designs and a technique for forming a lens over an LED die.

BACKGROUND

LED dies typically emit light in a lambertian pattern. It is common to use a lens over the LED die to narrow the beam or to make a side-emission pattern. A common type of lens for a surface mounted LED is preformed molded plastic, which is bonded to a package in which the LED die is mounted. One such lens is shown in U.S. Pat. No. 6,274,924, assigned to Lumileds Lighting and incorporated herein by reference.

SUMMARY

A technique for forming a lens for surface mounted LEDs is described herein along with various designs of lenses. One particularly useful lens creates a wide emission pattern so that light from multiple LEDs in a backlight is thoroughly mixed to create a homogenous light source in a liquid crystal display (LCD) backlight.

In one method for forming lenses, one LED die or multiple LED dice are mounted on a support structure. The support structure may be a ceramic substrate, a silicon substrate, or other type of support structure with the LED dice electrically connected to metal pads on the support structure. The support structure may be a submount, which is mounted on a circuit board or a heat sink in a package.

A mold has indentations in it corresponding to the positions of the LED dice on the support structure. The indentations are filled with a liquid, optically transparent material, such as silicone, which when cured forms a hardened lens material. The shape of the indentations will be the shape of the lens. The mold and the LED dice/support structure are brought together so that each LED die resides within the liquid lens material in an associated indentation.

The mold is then heated to cure (harden) the lens material. The mold and the support structure are then separated, leaving a complete lens over each LED die. This general process will be referred to as overmolding.

The overmolding process may be repeated with different molds to create concentric or overlapping shells of lenses. Each lens may have a different property, such as containing a phosphor, being a different material, providing a different radiation pattern, having a different hardness value, having a different index of refraction, or curable by a different technique (e.g., UV vs. heat).

In another embodiment, a secondary lens is secured over an overmolded lens. The overmolded lens simplifies the design and fabrication of the secondary lens.

In another embodiment, a wide-emitting lens is described that does not require an overmolded lens.

DETAILED DESCRIPTION

As a preliminary matter, a conventional LED is formed on a growth substrate. In the example used, the LED is a GaN-based LED, such as an AlInGaN LED, for producing blue or UV light. Typically, a relatively thick n-type GaN layer is grown on a sapphire growth substrate using conventional techniques. The relatively thick GaN layer typically includes a low temperature nucleation layer and one or more additional layers so as to provide a low-defect lattice structure for the n-type cladding layer and active layer. One or more n-type cladding layers are then formed over the thick n-type layer, followed by an active layer, one or more p-type cladding layers, and a p-type contact layer (for metallization).

Various techniques are used to gain electrical access to the n-layers. In a flip-chip example, portions of the p-layers and active layer are etched away to expose an n-layer for metallization. In this way the p contact and n contact are on the same side of the chip and can be directly electrically attached to the package (or submount) contact pads. Current from the n-metal contact initially flows laterally through the n-layer. In contrast, in a vertical injection (non-flip-chip) LED, an n-contact is formed on one side of the chip, and a p-contact is formed on the other side of the chip. Electrical contact to one of the p or n-contacts is typically made with a wire or a metal bridge, and the other contact is directly bonded to a package (or submount) contact pad. A flip-chip LED is used in the examples of FIGS. 1-3 for simplicity.

Examples of forming LEDs are described in U.S. Pat. Nos. 6,649,440 and 6,274,399, both assigned to Lumileds Lighting and incorporated by reference.

Optionally, a conductive substrate is bonded to the LED layers (typically to the p-layers) and the sapphire substrate is removed. One or more LED dice may be bonded to a submount, with the conductive substrate directly bonded to the submount, to be described in greater detail with respect to FIGS. 5 and 6. One or more submounts may be bonded to a printed circuit board, which contains metal leads for connection to other LEDs or to a power supply. The circuit board may interconnect various LEDs in series and/or parallel.

The particular LEDs formed and whether or not they are mounted on a submount is not important for purposes of understanding the invention.

Figure 1:
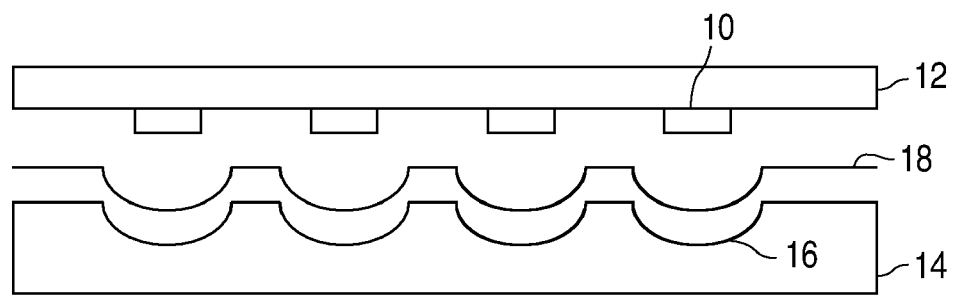
FIG. 1 is a side view of four LED dice mounted on a support structure, such as a submount, and a mold for forming a lens around each LED die.

FIG. 1 is a side view of four LED dice 10 mounted on a support structure 12. The support structure may be a submount (e.g., ceramic or silicon with metal leads), a metal heat sink, a printed circuit board, or any other structure. In the present example, the support structure 12 is a ceramic submount with metal pads/leads.

A mold 14 has indentations 16 corresponding to the desired shape of a lens over each LED die 10. Mold 14 is preferably formed of a metal. A very thin non-stick film 18, having the general shape of mold 14, is placed over mold 14. Film 18 is of a well known conventional material that prevents the sticking of silicone to metal.

Film 18 is not needed if the lens material does not stick to the mold. This may be accomplished by using a non-stick mold coating, using a non-stick mold material, or using a mold process that results in a non-stick interface. Such processes may involve selecting certain process temperatures to obtain the minimum stick. By not using film 18, more complex lenses can be formed.

Figure 2:
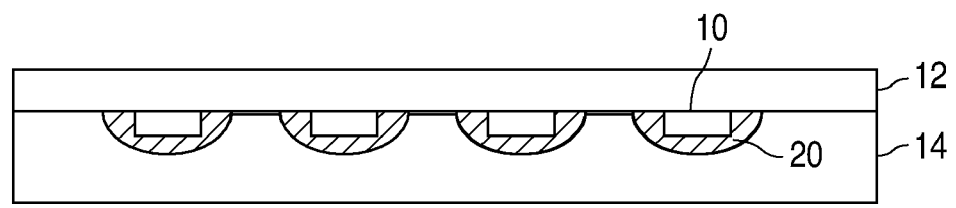
FIG. 2 is a side view of the LED dice being inserted into indentations in the mold filled with a liquid lens material.

In FIG. 2, the mold indentations 16 have been filled with a heat-curable liquid lens material 20. The lens material 20 may be any suitable optically transparent material such as silicone, an epoxy, or a hybrid silicone/epoxy. A hybrid may be used to achieve a matching coefficient of thermal expansion (CTE). Silicone and epoxy have a sufficiently high index of refraction (greater than 1.4) to greatly improve the light extraction from an AlInGaN or AlInGaP LED as well as act as a lens. One type of silicone has an index of refraction of 1.76.

A vacuum seal is created between the periphery of the support structure 12 and mold 14, and the two pieces are pressed against each other so that each LED die 10 is inserted into the liquid lens material 20 and the lens material 20 is under compression.

The mold is then heated to about 150 degrees centigrade (or other suitable temperature) for a time to harden the lens material 20.

The support structure 12 is then separated from mold 14. Film 18 causes the resulting hardened lens to be easily released from mold 14. Film 18 is then removed.

In another embodiment, the LED dice 10 in FIG. 1 may be first covered with a material, such as silicone or phosphor particles in a binder. The mold indentations 16 are filled with another material. When the dice are then placed in the mold, the mold material is shaped over the covering material.

Figure 3:
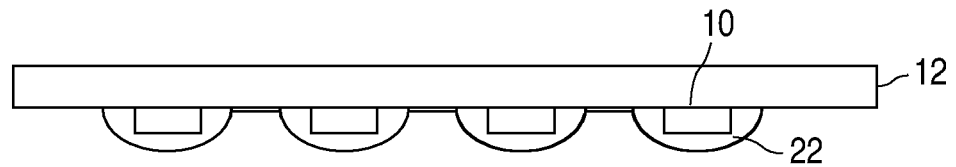
FIG. 3 is a side view of the LED dice removed from the mold after the liquid has been cured, resulting in a lens encapsulating each LED die.

FIG. 3 illustrates the resulting structure with a molded lens 22 over each LED die 10. In one embodiment, the molded lens is between 1 mm and 5 mm in diameter. The lens 22 may be any size or shape.

Figure 4:
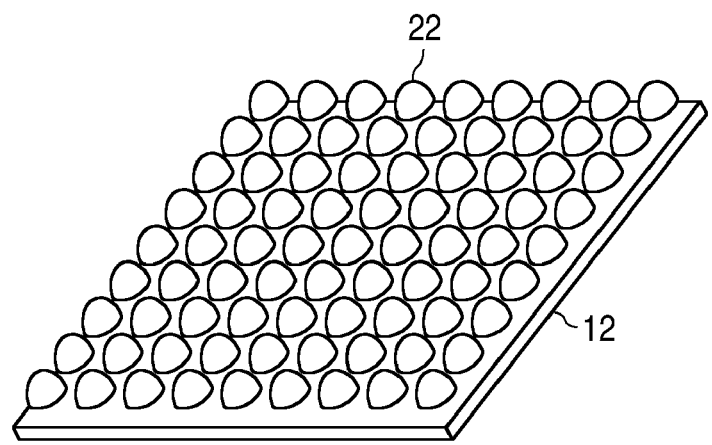
FIG. 4 is a perspective view of an array of LED dice on a submount or circuit board with a molded lens formed over each LED die.

FIG. 4 is a perspective view of a resulting structure where the support structure 12 supports an array of LED dice, each having a molded lens 22. The mold used would have a corresponding array of indentations. If the support structure 12 were a ceramic or silicon submount, each LED (with its underlying submount portion) can be separated by sawing or breaking the submount 12 to form individual LED dice. Alternatively, the support structure 12 may be separated/diced to support subgroups of LEDs or may be used without being separated/diced.

The lens 22 not only improves the light extraction from the LED die and refracts the light to create a desired emission pattern, but the lens also encapsulates the LED die to protect the die from contaminants, add mechanical strength, and protect any wire bonds.

Figure 5:
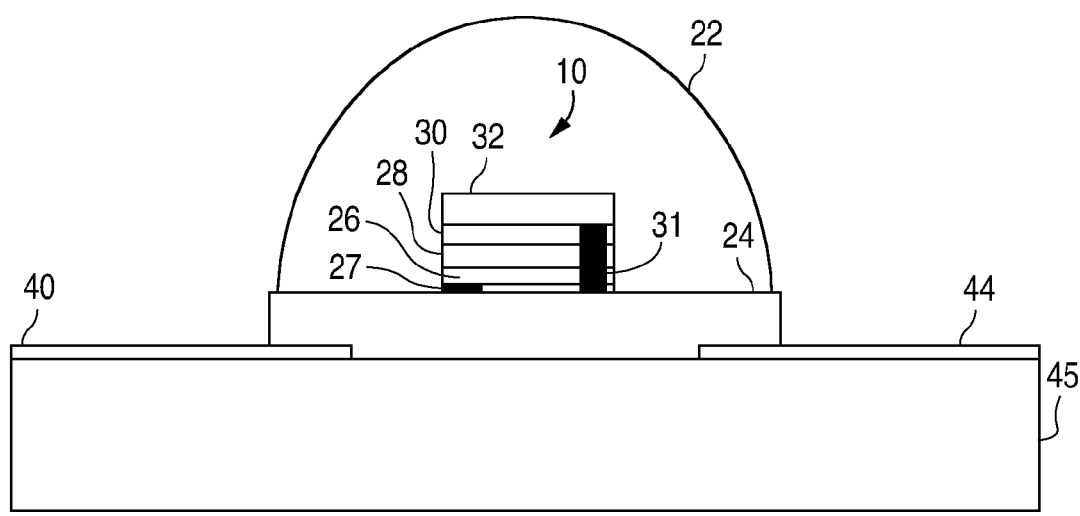
FIG. 5 is a close-up side view of a flip-chip LED die mounted on a submount, which is, in turn, mounted on a circuit board, and where a molded lens is formed over the LED die.

FIG. 5 is a simplified close-up view of one embodiment of a single flip-chip LED die 10 on a submount 24 formed of any suitable material, such as a ceramic or silicon. In one embodiment, submount 24 acted as the support structure 12 in FIGS. 1-4, and the die/submount of FIG. 5 was separated from the structure of FIG. 4 by sawing. The LED die 10 of FIG. 5 has a bottom p-contact layer 26, a p-metal contact 27, p-type layers 28, a light emitting active layer 30, n-type layers 32, and an n-metal contact 31 contacting the n-type layers 32. Metal pads on submount 24 are directly metal-bonded to contacts 27 and 31. Vias through submount 24 terminate in metal pads on the bottom surface of submount 24, which are bonded to the metal leads 40 and 44 on a circuit board 45. The metal leads 40 and 44 are connected to other LEDs or to a power supply. Circuit board 45 may be a metal plate (e.g., aluminum) with the metal leads 40 and 44 overlying an insulating layer. The molded lens 22, formed using the technique of FIGS. 1-3, encapsulates the LED die 10.

The LED die 10 in FIG. 5 may also be a non-flip-chip die, with a wire connecting the top n-layers 32 to a metal pad on the submount 24. The lens 22 may encapsulate the wire.

Figure 6:
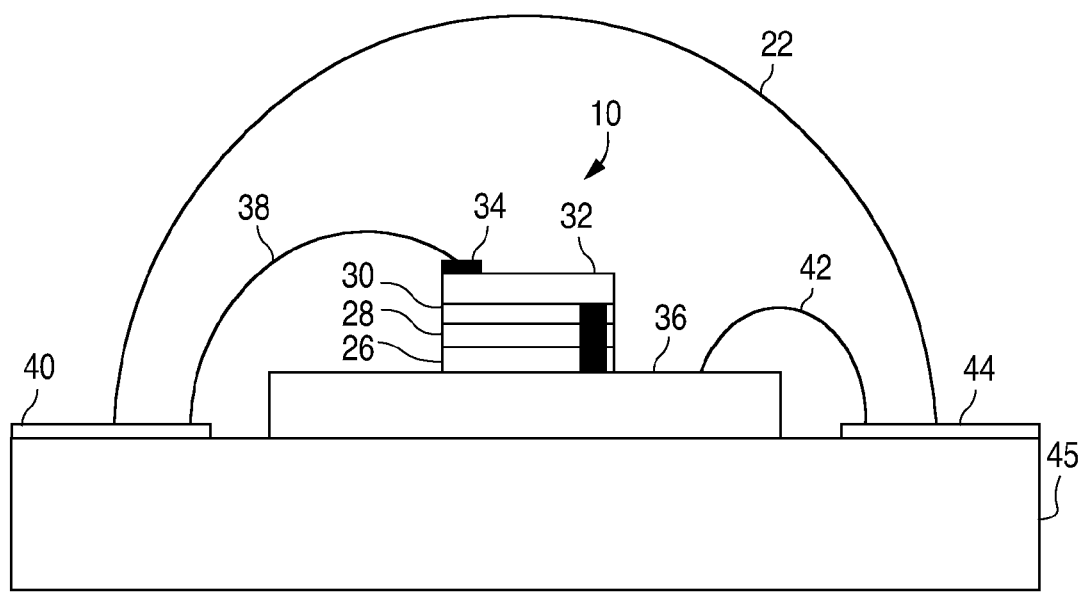
FIG. 6 is a close-up side view of a non-flip-chip LED die mounted on a submount, which is, in turn, mounted on a circuit board, where wires electrically connect n and p metal on the LED die to leads on the circuit board, and where a molded lens is formed over the LED die.

In one embodiment, the circuit board 45 itself may be the support structure 12 of FIGS. 1-3. Such an embodiment is shown in FIG. 6. FIG. 6 is a simplified close-up view of a non-flip-chip LED die 10 having a top n-metal contact 34 connected to a metal lead 40 on circuit board 45 by a wire 38. The LED die 10 is mounted on a submount 36, which in the example of FIG. 6 is a metal slab. A wire 42 electrically connects the p-layers 26/28 to a metal lead 44 on circuit board 45. The lens 22 is shown completely encapsulating the wires and submount 36; however, in other embodiments the entire submount or the entire wire need not be encapsulated.

A common prior art encapsulation method is to spin on a protective coating. However, that encapsulation process is inappropriate for adding a phosphor coating to the LED die since the thickness of the encapsulant over the LED die is uneven. Also, such encapsulation methods do not form a lens. A common technique for providing a phosphor over the LED die is to fill a reflective cup surrounding the LED die with a silicone/phosphor composition. However, that technique forms a phosphor layer with varying thicknesses and does not form a suitable lens. If a lens is desired, additional processes still have to create a plastic molded lens and affix it over the LED die.

FIGS. 7-11 illustrate various lenses that may be formed using the above-described techniques.

Figure 7:
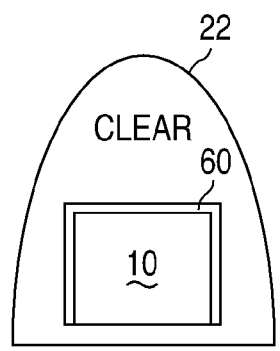
FIGS. 7, 8, 9, 10, and 11 are cross-sectional views of an LED die with different lenses formed over it.
Figure 8:
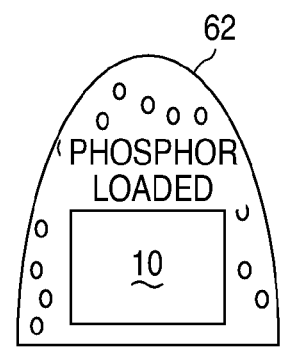

FIG. 7 illustrates an LED die 10 that has been coated with a phosphor 60 using any suitable method. One such method is by electrophoresis, described in U.S. Pat. No. 6,576,488, assigned to Lumileds Lighting and incorporated herein by reference. Suitable phosphors are well known. A lens 22 is formed using the techniques described above. The phosphor 60 is energized by the LED emission (e.g., blue or UV light) and emits light of a different wavelength, such as green, yellow, or red. The phosphor emission alone or in conjunction with the LED emission may produce white light.

Processes for coating an LED with a phosphor are time-consuming. To eliminate the process for coating the LED die with a phosphor, the phosphor powder may be mixed with the liquid silicone so as to become embedded in the lens 62, shown in FIG. 8.

Figure 9:
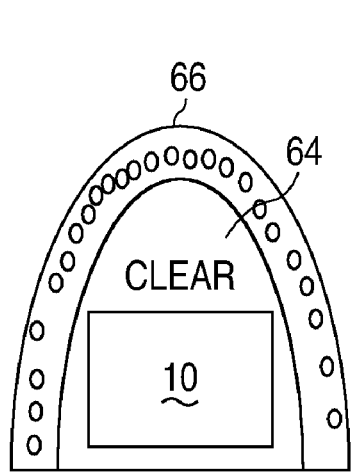

As shown in FIG. 9, to provide a carefully controlled thickness of phosphor material over the LED die, an inner lens 64 is formed using the above-described techniques, and a separate molding step (using a mold with deeper and wider indentations) is used to form an outer phosphor/silicone shell 66 of any thickness directly over the inner lens 64.

Figure 10:
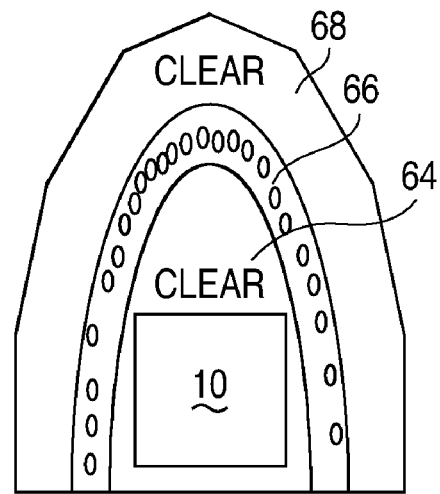

FIG. 10 illustrates an outer lens 68 that may be formed over the phosphor/silicone shell 66 using another mold to further shape the beam.

Figure 11:
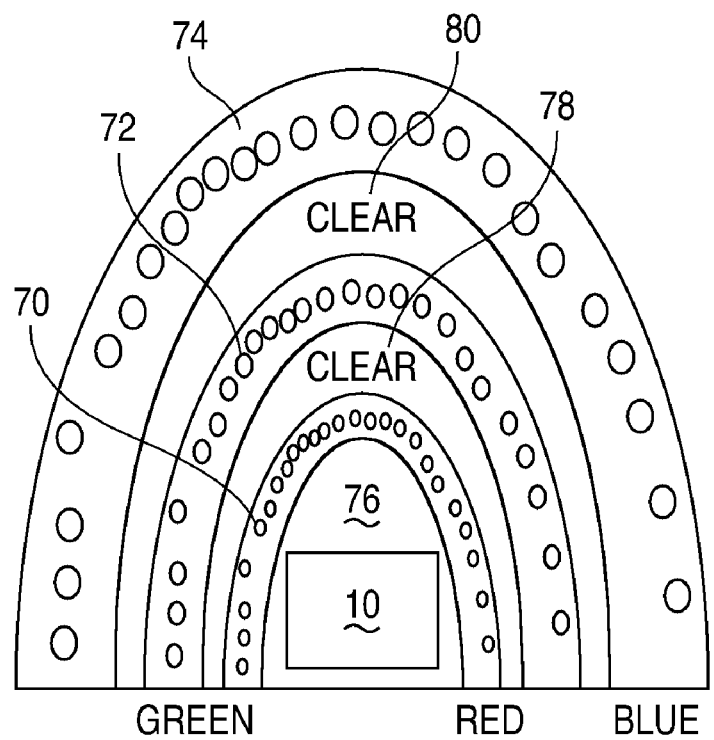

FIG. 11 illustrates shells 70, 72, and 74 of red, green, and blue-emission phosphors, respectively, overlying clear silicone shells 76, 78, and 80. In this case, LED die 10 emits UV light, and the combination of the red, green, and blue emissions produces a white light. All shells are produced with the above-described methods.

Figure 12:
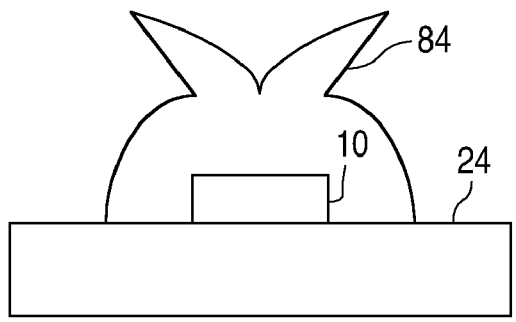
FIG. 12 is a cross-sectional view of a side-emitting lens molded onto the LED die using the inventive techniques.

Many other shapes of lenses can be formed using the molding technique described above. FIG. 12 is a cross-sectional view of LED 10, submount 24, and a molded side-emitting lens 84. In one embodiment, lens 84 is formed of a very flexible material, such as silicone, which flexes as it is removed from the mold. When the lens is not a simple shape, the release film 18 (FIG. 1) will typically not be used.

Figure 13:
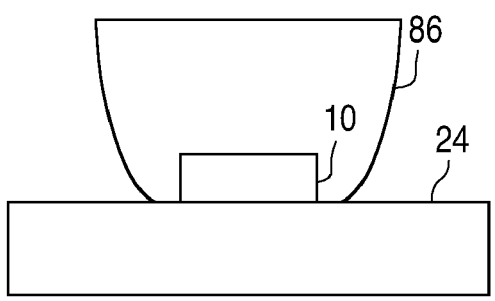
FIG. 13 is a cross-sectional view of a collimating lens molded onto the LED die using the inventive techniques.

FIG. 13 is a cross-sectional view of LED 10, submount 24, and a molded collimating lens 86. The lens 86 can be produced using a deformable mold or by using a soft lens material that compresses when being pulled from the mold and expands to its molded shape after being released from the mold.

Figure 14:
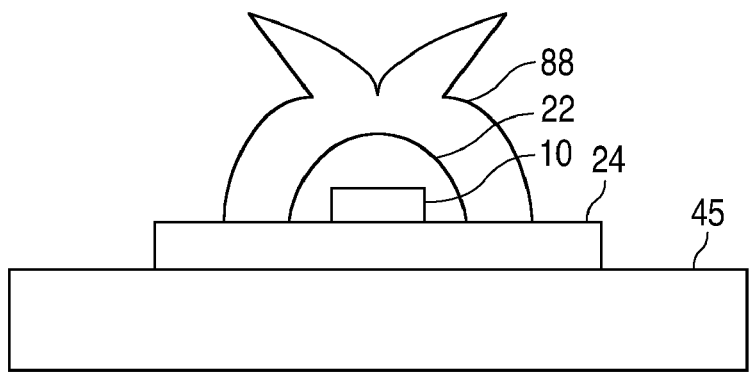
FIG. 14 is a cross-sectional view of a preformed side-emitting lens affixed over a lambertian lens that has been molded onto the LED die using the inventive techniques.

FIG. 14 illustrates how a preformed lens 88 can be affixed over a molded lambertian lens 22. In the example of FIG. 14, lens 22 is formed in the previously described manner. Lens 22 serves to encapsulate and protect LED 10 from contaminants. A preformed side-emitting lens 88 is then affixed over lens 22 using a UV curable adhesive or a mechanical clamp. This lens-forming technique has advantages over conventional techniques. In a conventional technique, a preformed lens (e.g., a side emitting lens) is adhesively affixed over the LED die, and any gaps are filled in by injecting silicone. The conventional process is difficult to perform due to, among other reasons, carefully positioning the separated die/submount for the lens placement and gap-filling steps. Using the inventive technique of FIG. 14, a large array of LEDs (FIG. 4) can be encapsulated simultaneously by forming a molded lens over each. Then, a preformed lens 88 can be affixed over each molded lens 22 while the LEDs are still in the array (FIG. 4) or after being separated.

Additionally, the molded lens can be made very small (e.g., 1-2 mm diameter), unlike a conventional lens. Thus, a very small, fully encapsulated LED can be formed. Such LEDs can be made to have a very low profile, which is beneficial for certain applications.

FIG. 14 also shows a circuit board 45 on which submount 24 is mounted. This circuit board 45 may have mounted on it an array of LEDs/submounts 24.

Figure 15:
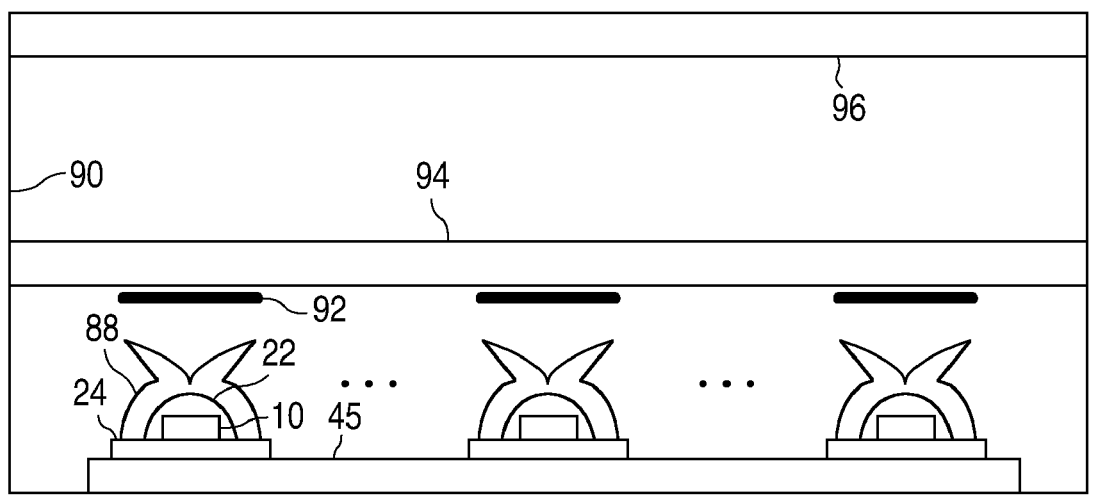
FIG. 15 is a cross-sectional view of a backlight for a liquid crystal display or other type of display using the LED and side-emitting lens of FIG. 14.

FIG. 15 is a cross-sectional view of a backlight for a liquid crystal display (LCD) or other display that uses a backlight. Common uses are for televisions, monitors, cellular phones, etc. The LEDs may be red, green, and blue to create white light. The LEDs form a two-dimensional array. In the example shown, each LED structure is that shown in FIG. 14, but any suitable lens may be used. The bottom and sidewalls 90 of the backlight box are preferably coated with a white reflectively-diffusing material. Directly above each LED is a white diffuser dot 92 to prevent spots of light from being emitted by the backlight directly above each LED. The dots 92 are supported by a transparent or diffusing PMMA sheet 94. The light emitted by the side-emitting lenses 88 is mixed in the lower portion of the backlight, then further mixed in the upper portion of the backlight before exiting the upper diffuser 96. Linear arrays of LEDs may be mounted on narrow circuits boards 45.

Figure 16:
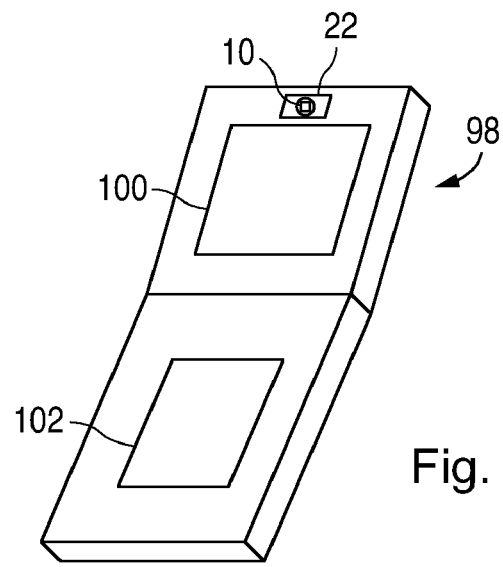
FIG. 16 is a perspective view of a cell phone with a camera that uses as a flash an LED with a molded lens.

FIG. 16 illustrates an LED 10 with a molded lens 22 being used as a flash in a camera. The camera in FIG. 16 is part of a cellular telephone 98. The cellular telephone 98 includes a color screen 100 (which may have a backlight using the LEDs described herein) and a keypad 102.

As discussed with respect to FIG. 10, an outer lens may be formed over the inner shell to further shape the beam. Different shell materials may be used, depending on the requirements of the various shells. FIGS. 17-30 illustrate examples of various lenses and materials that may be used in conjunction with the overmolding process.

Figure 17:
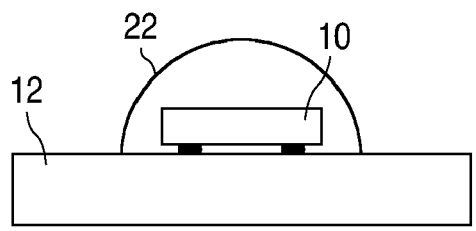
FIGS. 17 and 18 are cross-sectional views of two types of molded lenses. All lenses shown are symmetrical about the center axis, although the invention may apply to non-symmetrical lenses as well.
Figure 18:
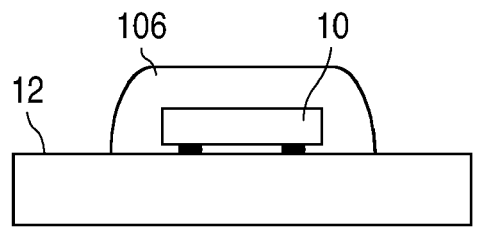

FIGS. 17 and 18 illustrate two shapes of molded lenses for an inner shell formed using the molding techniques described above. Many LEDs 10 may be mounted on the same support structure 12. The support structure 12 may be a ceramic or silicon submount with metal traces and contact pads, as previously described. Any number of LEDs may be mounted on the same support structure 12, and all LEDs on the same support structure 12 would typically be processed in an identical manner, although not necessarily. For example, if the support structure were large and the light pattern for the entire LED array were specified, each LED lens may differ to provide the specified overall light pattern.

An underfill material may be injected to fill any gap between the bottom of the LED die 10 and the support substrate 12 to prevent any air gaps under the LED and to improve heat conduction, among other things.

FIG. 17 has been described above with respect to FIGS. 3-6, where the inner molded lens 22 is generally hemispherical for a lambertian radiation pattern. The inner molded lens 106 in FIG. 18 is generally rectangular with rounded edges. Depending on the radiation pattern to be provided by an outer lens, one of the inner molded lenses 22 or 106 may be more suitable. Other shapes of inner molded lenses may also be suitable. The top down view of each lens will generally be circular.

Figure 19:
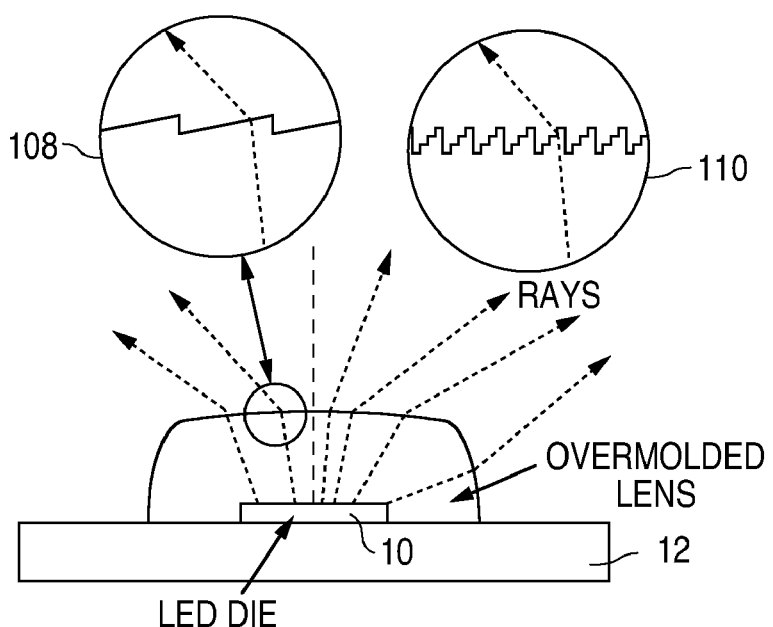
FIGS. 19-22 illustrate surface features on an inner lens or an outer shell lens for obtaining a desired emission pattern.
Figure 20:
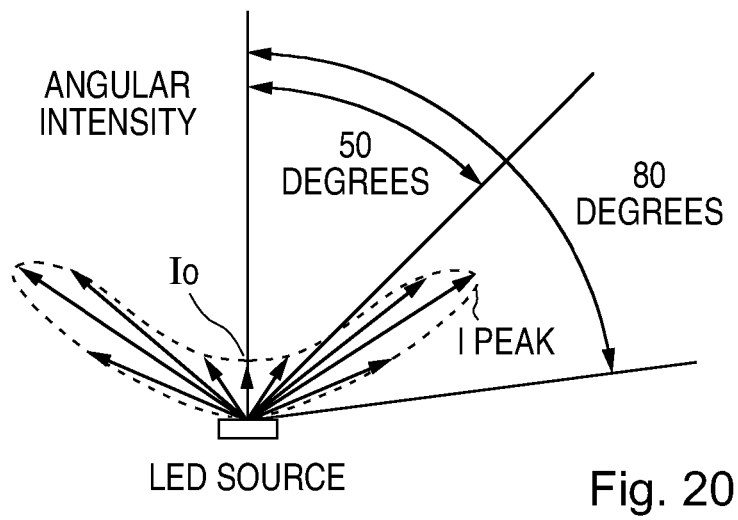

FIG. 19 illustrates the structure of FIG. 18 with the lens outer surface having a pattern that refracts light to achieve a desired radiation pattern. The outer surface pattern may be directly formed in the inner molded lens (by the mold itself), or the outer surface pattern may be formed in an outer lens that is overmolded onto the inner molded lens or is affixed to it by an adhesive (e.g., silicone, epoxy, etc.). Pattern 108 is a diffraction grating, while pattern 110 uses binary steps to refract the light. In the examples, the pattern forms a generally side-emitting lens with the radiation pattern shown in FIG. 20. In FIG. 20, the peak intensity occurs within 50-80 degrees and is significantly greater than the intensity at 0 degrees.

The requirements for the inner lens are generally different from the requirements for the outer lens. For example, the inner lens should have good adhesion to the support structure, not yellow or become more opaque over time, have a high index of refraction (greater than 1.4), not break or stress any wires to the LED, withstand the high LED temperatures, and have a compatible thermal coefficient. The inner lens should be non-rigid (e.g., silicone) to not provide stress on the LED or any wires. In contrast, the outer lens material generally only needs to be able to be patterned with the desired pattern and adhere to the inner lens. The outer lens may overmolded or may be preformed and adhesively affixed to the inner lens. The material for the outer lens may be UV curable, while the material for the inner lens may be thermally cured. Thermal curing takes longer than UV curing.

Generally, the range of hardness for the inner lens material is Shore 00 5-90, while the range of hardness for the outer shell(s) is Shore A 30 or more.

Figure 21:
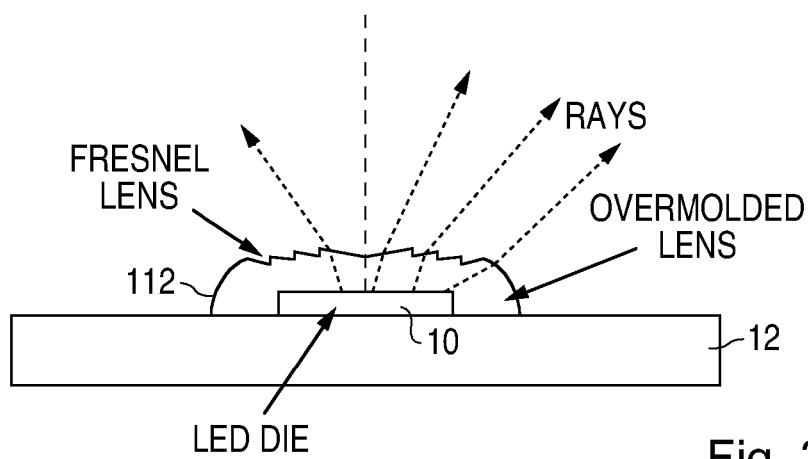

FIG. 21 illustrates a Fresnel lens pattern 112 formed on the outer surface of the lens for creating a generally side-emitting light pattern similar to that of FIG. 20. The outer surface may be the outer surface of the inner molded lens or the outer surface of an outer shell, as described with respect to FIG. 19. This applies to all patterns described herein.

Figure 22:
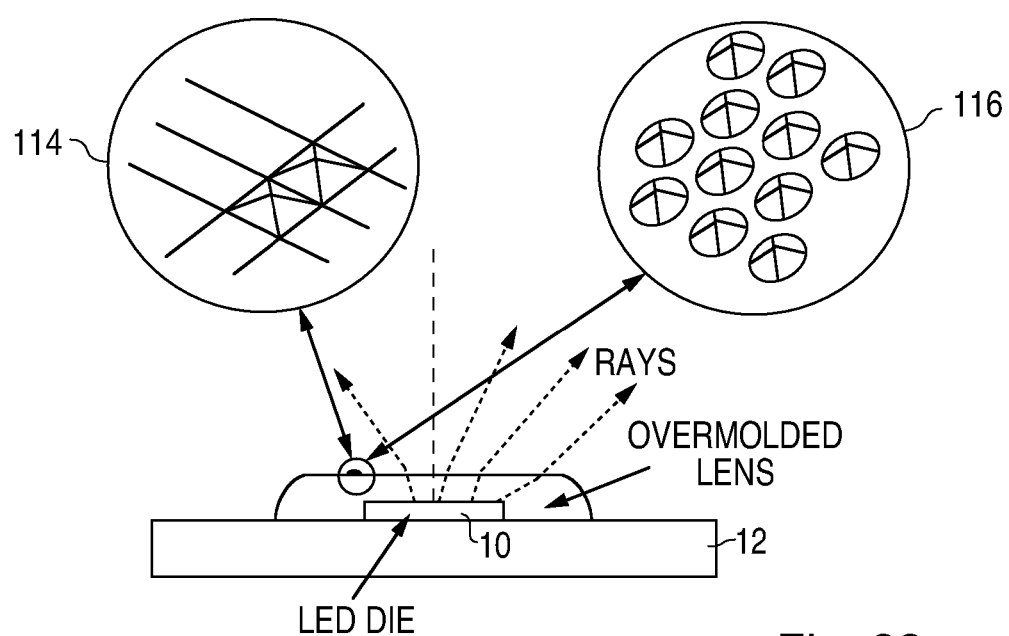

FIG. 22 illustrates pyramid 114 or cone shaped 116 patterns on the outer lens surface to create a collimating light pattern or another light pattern.

Figure 23:
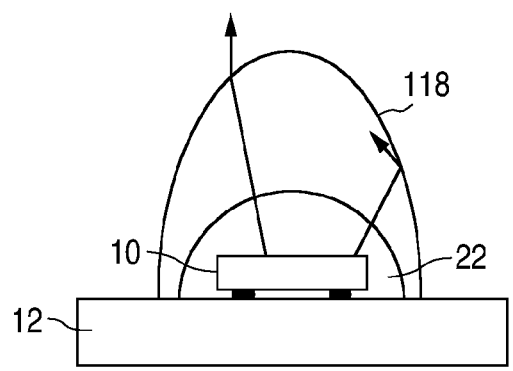
FIG. 23 illustrates the use of a high domed lens for a collimated emission pattern.

FIG. 23 illustrates a high dome outer lens 118 for creating a collimating pattern.

The surface patterns of FIGS. 19 and 21-23 may be configured (e.g., by changing the surface angles) to create any light pattern. Holographic structures, TIR, and other patterns may be formed. Collimating light patterns are typically used for rear projection TVs, while side-emitting light patterns are typically used for backlighting LCD screens.

Figure 24:
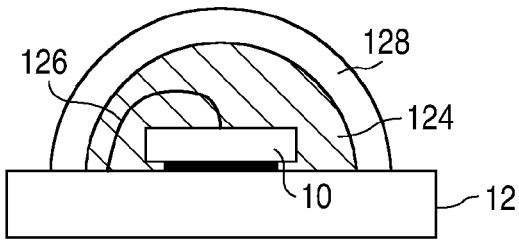
FIGS. 24 and 25 illustrate the use of a hard outer lens and a soft inner lens to limit the stress on a wire bond.

FIG. 24 illustrates the use of a soft (e.g, Shore XX) material, such as a silicone gel, as the inner molded lens 124 so as to not stress the wire 126 bonded to the LED 10. The gel is typically UV cured. The outer lens 128 may be molded or preformed and affixed with an adhesive. The outer lens 128 will typically be much harder for durability, resistance to particles, etc. The outer lens 128 may be silicone, epoxy-silicone, epoxy, silicone elastomers, hard rubber, other polymers, or other material. The outer lens may be UV or thermally cured.

Figure 25:
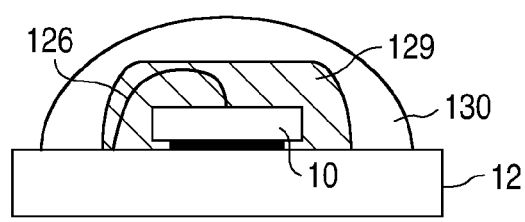

FIG. 25 is similar to FIG. 24 but with a different shaped inner molded lens 129 (like FIG. 18) for a different emission pattern or a lower profile. Lens 129 may be a soft silicone gel. The outer lens 130 will further shape the emission pattern and protect the soft inner lens 129.

The LEDs in all figures may be flip-chips or wire bonded types.

Figure 26:
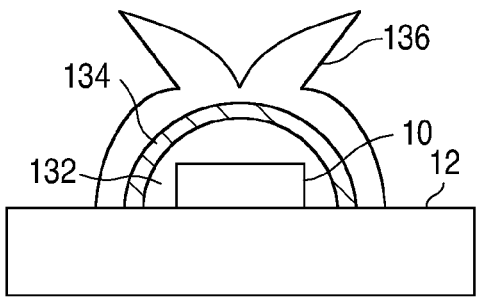
FIGS. 26-28 illustrate the use of an outer lens formed on various types of inner or intermediate lenses for a side-emitting pattern.

FIG. 26 illustrates an LED structure with a soft inner molded lens 132, having the properties needed for the inner lens, a hard intermediate shell 134 to act as an interface layer and for structural stability, and an outer lens 136 for creating a side-emitting light pattern. The outer lens 136 may be soft to facilitate the molding process. Alternatively, the outer lens 136 may be preformed and adhesively affixed to the intermediate shell 134. The use of the intermediate shell 134 makes the choice of the outer lens material essentially independent of the inner lens material.

Figure 27:
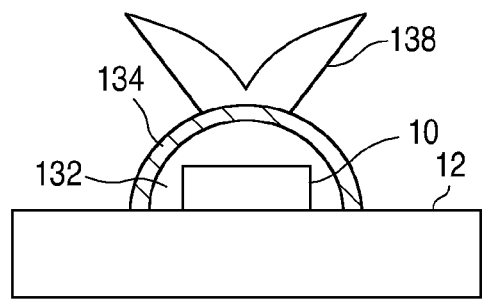

FIG. 27 illustrates how the outer lens 138 may be formed on any portion of the intermediate shell 134 or inner lens 132.

Figure 28:
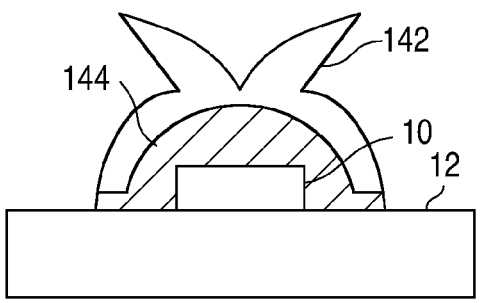

FIG. 28 illustrates the formation of the outer lens 142 directly on the inner lens 144 material.

Figure 29:
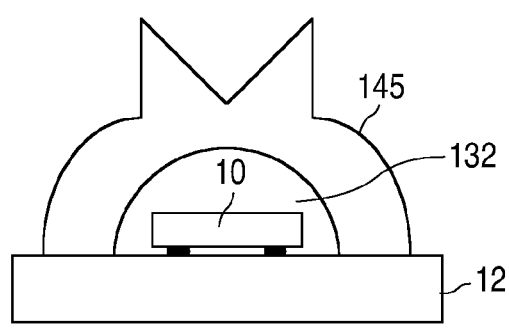
FIG. 29 illustrates another side-emitting molded lens.

FIG. 29 illustrates another shape of side-emitting lens 145 molded over an inner lens 132. Lens 145 may be directly molded over LED die 10 without any inner lens.

Figure 30:
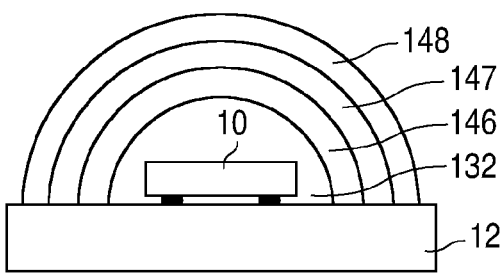
FIG. 30 illustrates the use of molded shells, each containing a different phosphor.

FIG. 30 illustrates an LED where each shell 146, 147, and 148 contains a different phosphor material, such as a red-emitting phosphor, a green-emitting phosphor, and a blue-emitting phosphor. The LED die 10 may emit UV. The gaps between phosphor particles allow the UV to pass through an inner shell to energize the phosphor in an outer shell. Alternatively, only red and green phosphor shells are used, and the LED die 10 emits blue light. The combination of red, green, and blue light create white light. The thickness of the shells, the density of the phosphor particles, and the order of the phosphor colors, among other things, can be adjusted to obtain the desired light. Any shape of lenses may be used.

Figure 31:
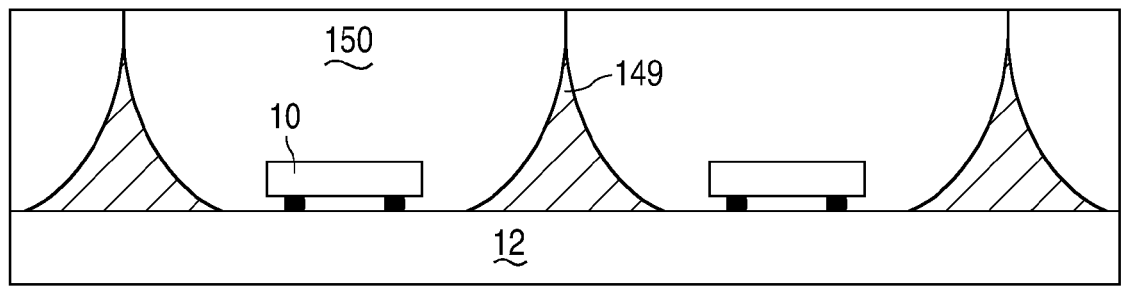
FIG. 31 illustrates forming a mold portion on the support substrate for forming a molded lens.

FIG. 31 illustrates the use of a mold pattern 149 on the support structure 12 itself. A high index material (e.g., a polymer) or a reflective material (e.g., aluminum or silver) is formed by either molding the pattern on the support structure 12, using a method similar to the method shown in FIG. 1, or using a metallization process, or using another suitable process. The mold pattern 149 is then used as a mold for another material forming a lens 150. In one embodiment, the lens 150 material is a liquid (e.g., silicone) that is deposited in the mold formed on the support structure 12, then cured. The surface may then be planarized. The resulting lens collimates the light by reflecting/refracting the light impinging on the walls like a reflector cup.

Figure 32:
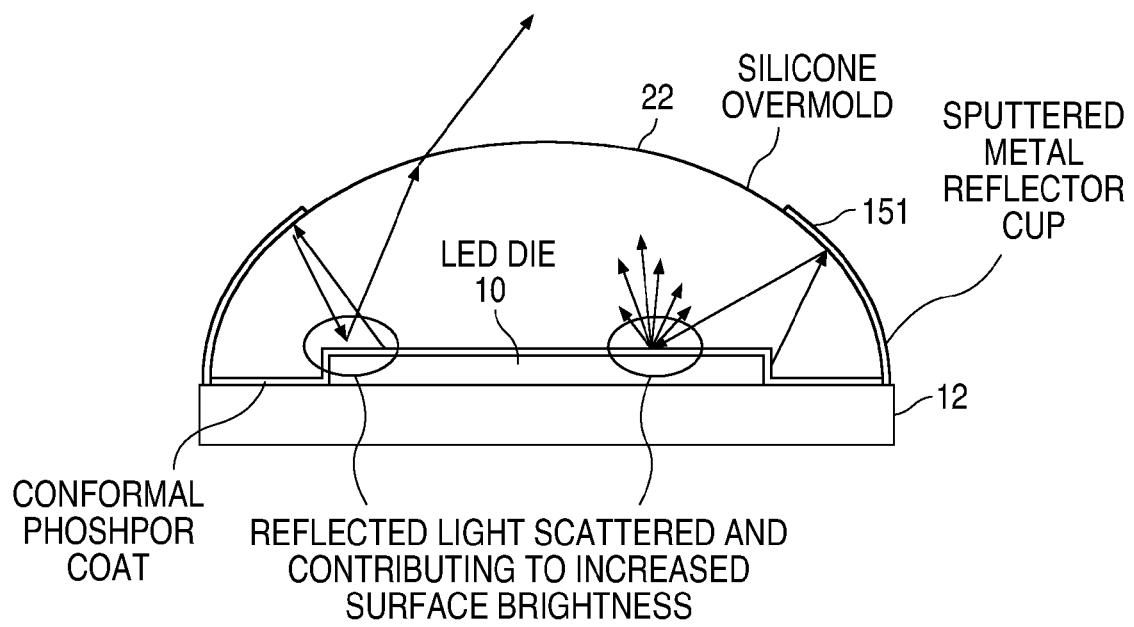
FIG. 32 illustrates depositing a metal reflector over a portion of the lens for achieving a desired emission pattern.

FIG. 32 illustrates a molded lens 22 with metal 151 sputtered around its side to reflect light emitted by the LED 10. The reflected light will be scattered by the LED 10 and be eventually emitted through the top opening. The metal 151 may be any reflective material such as aluminum or silver. The metal may instead be sputtered on the top of the lens 22 to create a side-emission pattern. The lens 22 may be made any shape to create the desired light emission pattern.

Figure 33:
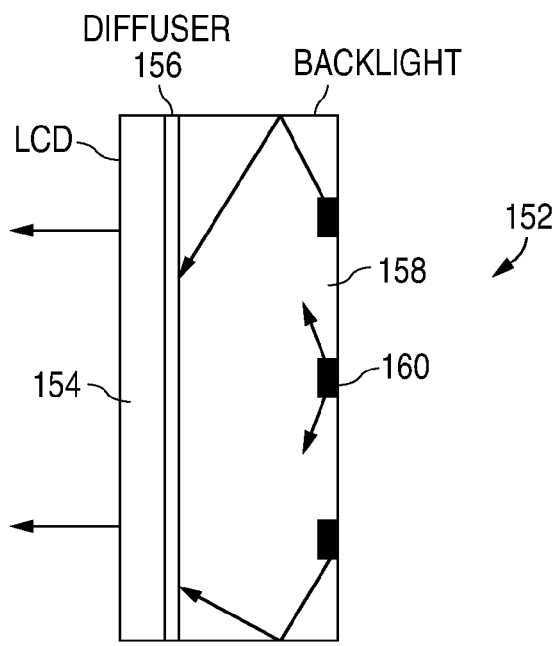
FIG. 33 is a side view of a liquid crystal display using LEDs with side-emitting lenses in a backlight.

FIG. 33 is a side view of a liquid crystal display (LCD) 152 with an LCD screen 154, having controllable RGB pixels, a diffuser 156, and a backlight 158 for mixing light from red, green, and blue LEDs 160 to create white light. The backlight 158 is a diffusively reflective box. The LEDs 160 have side-emitting lenses made using any of the above-described techniques.

Figure 34:
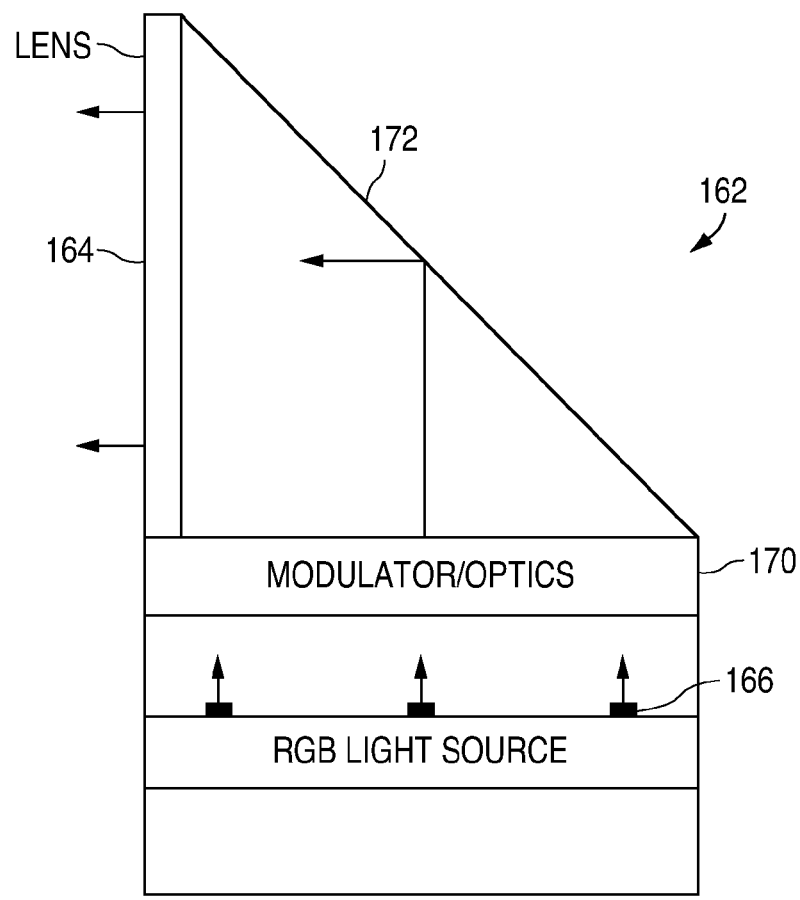
FIG. 34 is a side view of a rear projection TV using LEDs with collimating lenses as a RGB light source.

FIG. 34 is a side view of a rear projection television 162 with a front lens 164 for brightening the image within a specified viewing angle, a set of red, green, and blue LEDs 166, modulator/optics 170 for modulating and focusing the RGB light to produce a color TV image, and a reflector 172. The modulator may be an array of controllable mirrors, an LCD panel, or any other suitable device. The LEDs 166 have collimating lenses made using any of the above-described techniques.

As described above, the primary lens or secondary lens can be designed to create a side-emitting pattern. Such a side emitting pattern is particularly useful when light from multiple LEDs is intended to be mixed, such as when light from multiple LEDs is for creating a uniform backlight for an LCD panel, or for decorative lighting, or for another use.

Figure 35:
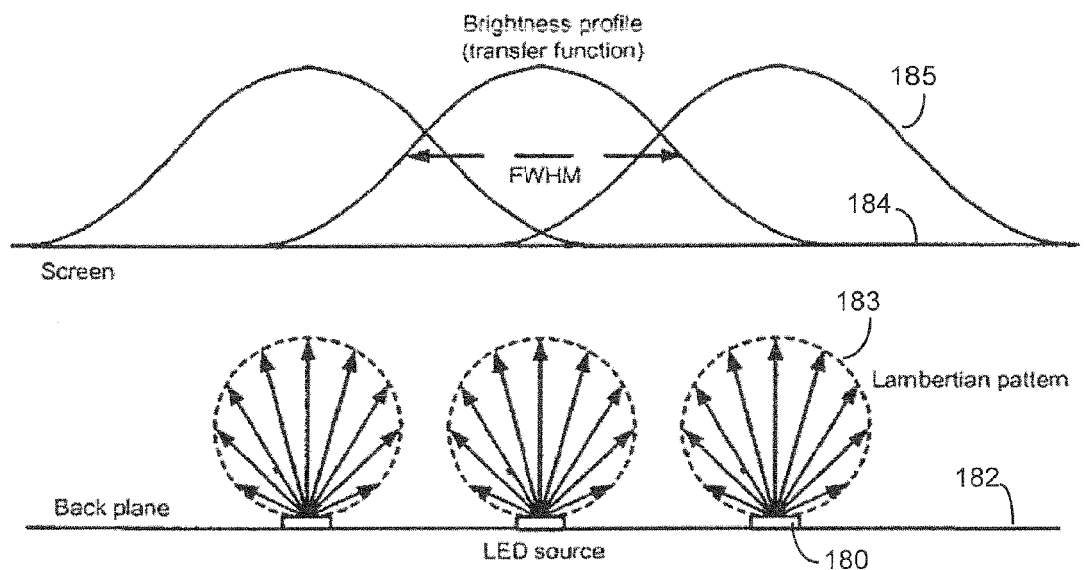
FIG. 35 illustrates prior art LED emission patterns (Lambertian) and their overlapping brightness profiles on a screen.

As shown in FIG. 35, LEDs 180, without lenses or with only hemispherical lenses, mounted on a backplane 182 will typically emit light in a Lambertian pattern 183. The array of LEDs 180 illuminates the back of a diffusive screen 184. The screen 184 may be the diffuser 156 in the LCD backlight of FIG. 33. The diffused brightness profile 185 of each LED and its Full Width At Half Maximum (FWHM) are also shown. The overall light output at the front of the screen 184 will have noticeable bright spots unless the LEDs are placed close enough together. Therefore, such a backlight requires a relatively high density of LEDs, resulting in an expensive backlight.

Figure 36:
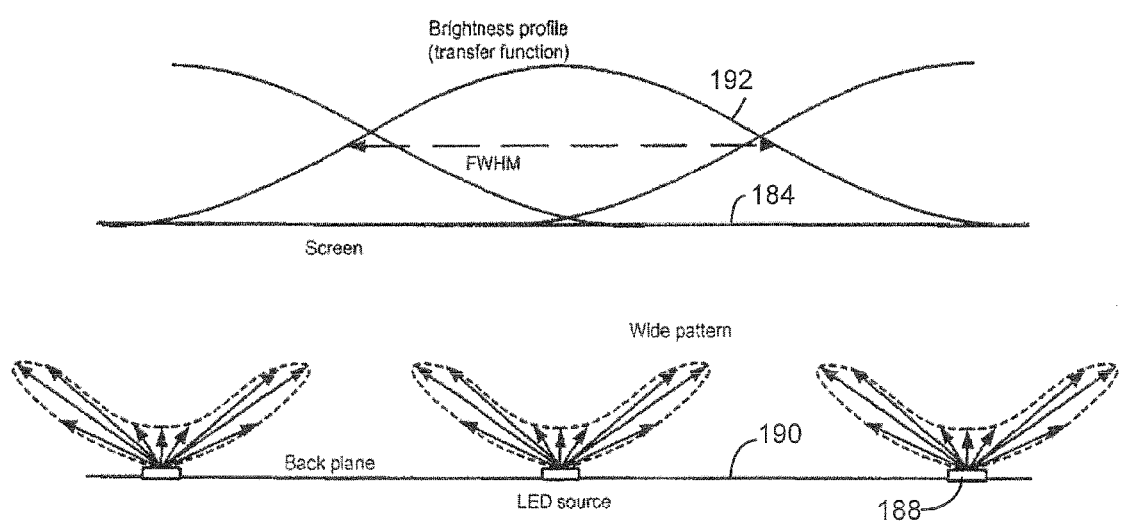
FIG. 36 illustrates the wide angle emission patterns of LEDs using the inventive lens and their overlapping brightness profiles on a screen.
Figure 37:
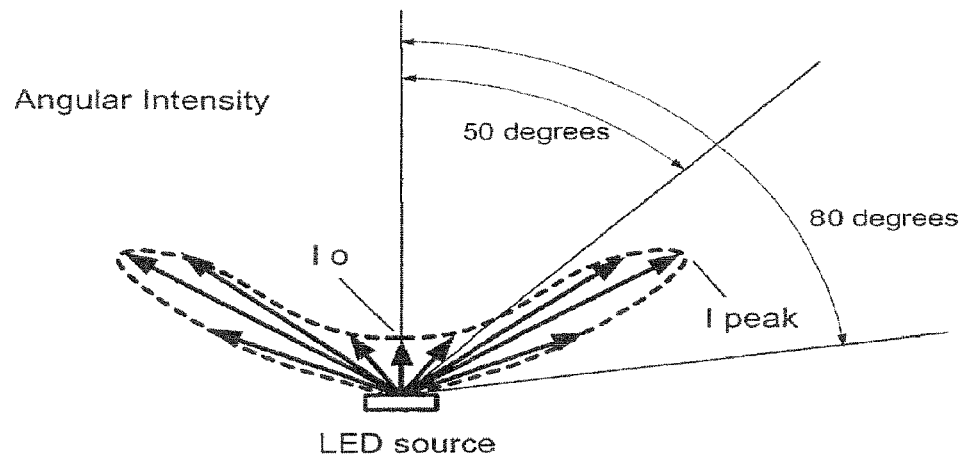
FIG. 37 shows more detail of the emission pattern of the LEDs in FIG. 36.
Figure 38:
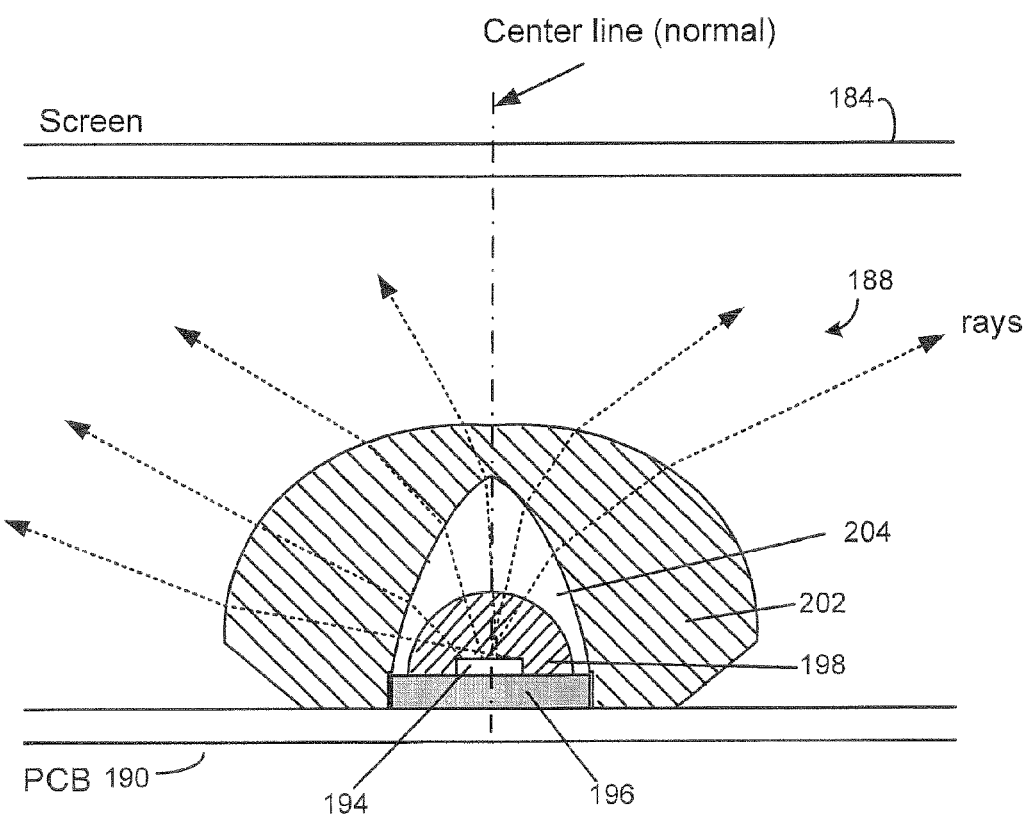
FIG. 38 is a cross-sectional view of an LED and a wide emitting lens in accordance with one embodiment of the invention.

Applicants have invented a wide-emitting lens, shown in FIGS. 36-38, that is particularly useful in a backlight. In FIG. 36, LEDs 188 with the wide-emitting lenses are shown mounted to a backplane 190. The peak light emission (Ipeak) for each LED die occurs within 50-80 degrees off the center axis (normal), as shown in FIG. 37. A range between 70-80 degrees is preferred. The lens is designed so that the light emission ($I_0$) along the center axis is 5%-33% of the peak emission. Accordingly, the brightness profile 192 for each LED is more spread out as compared to the brightness profile 185 in FIG. 35. Therefore, the LED 188 pitch in the backlight of FIG. 36 can be larger than the LED 180 pitch in FIG. 35 while achieving the same light output uniformity from the diffusive screen 184. This results in a less expensive backlight.

The brightness profile should have no sharp transitions like those that typically appear with funnel shaped lenses at the center cusp.

The optimum ratio of the center axis intensity to the 50-80 degree peak intensity will depend on the application, such as the pitch of the LEDs needed to achieve the specified brightness of the backlight. The peak intensity is at least three times the intensity along the center axis and, in the embodiment of FIG. 37, the ratio is between 4-8.

FIG. 38 is a cross-sectional view of one embodiment of a wide-emitting lens with the characteristics described above. An LED die 194 is mounted on a substrate or submount 196 made of ceramic, silicon, or other material, as described with respect to FIGS. 1-6, and a first lens 198 is molded over the LED die 194 as described with respect to FIGS. 1-6. Multiple dies may be mounted on a single large submount. Lens 198 may be formed of any suitable material such as silicone.

The submount 196 is then separated out and then mounted on a backplane 190 (a PCB) by a solder reflow technique or other suitable technique.

A secondary lens 202 is preformed to have the desired wide-emitting characteristics. The secondary lens may be injection-molded or machined plastic or other material. Such materials include COC, COP, PMMA, epoxy, silicone, glass, or any other suitable material. The secondary lens 202 is then mounted to overlie the first lens 198 and contact the backplane 190 for support. An air gap 204 (or other low index of refraction material gap) creates an internal refractive interface that bends light towards the sides. The interface of the outer surface of the secondary lens 202 with air further bends the light to achieve the peak intensity within 50-80 degrees. The secondary lens 202 may directly contact the first lens 198; however, the shape of the secondary lens 202 would have to be changed to achieve the same wide-emitting pattern.

In another embodiment, the secondary lens 202 contacts and is supported by the submount 196 rather than the backplane 190.

The secondary lens 202 may be fixed to the backplane or the submount with an adhesive such as epoxy or may be affixed with a snap-tab connection.

By fixing the secondary lens 202 referenced to the submount, slightly better control over the light emission is achieved as compared to fixing the secondary lens 202 referenced to the backplane because the height of the LED and first lens 198 above the backplane may vary slightly with the mounting parameters.

The aspherical secondary lens 202 with the aspherical dome internal air gap is a simple design that is easily molded. The lens 202 is undercut near the backplane 190 to reflect light upward at the undercut surface so that light is not emitted downward toward the backplane 190. This avoids light rings and increases the backlight's light output.

Figure 39:
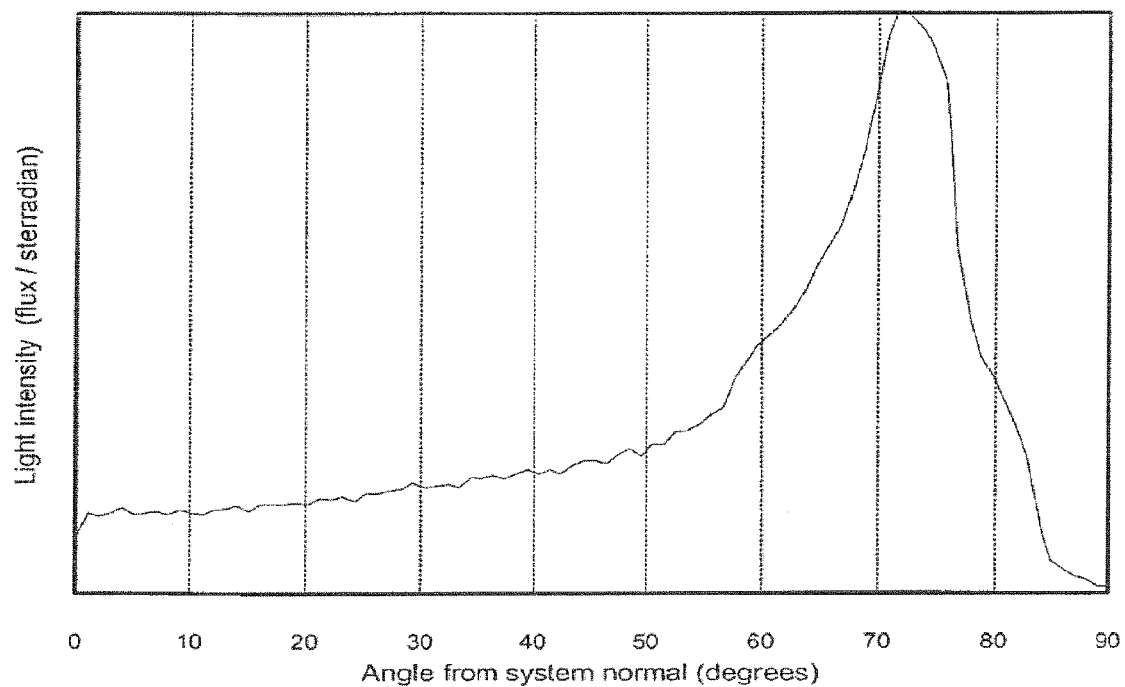
FIG. 39 is a graph of light intensity vs. angle for the lens of FIG. 38.

FIG. 39 shows the light intensity vs. angle for the LED of FIG. 38. The peak intensity is approximately 72 degrees, and the intensity along the center axis is approximately 10% of the peak intensity.

In another embodiment, the surface of the secondary lens 202 contains microstructures, as described with respect to FIGS. 19, 21, and 22, that further refract the light to achieve the desired emission pattern.

Figure 40:
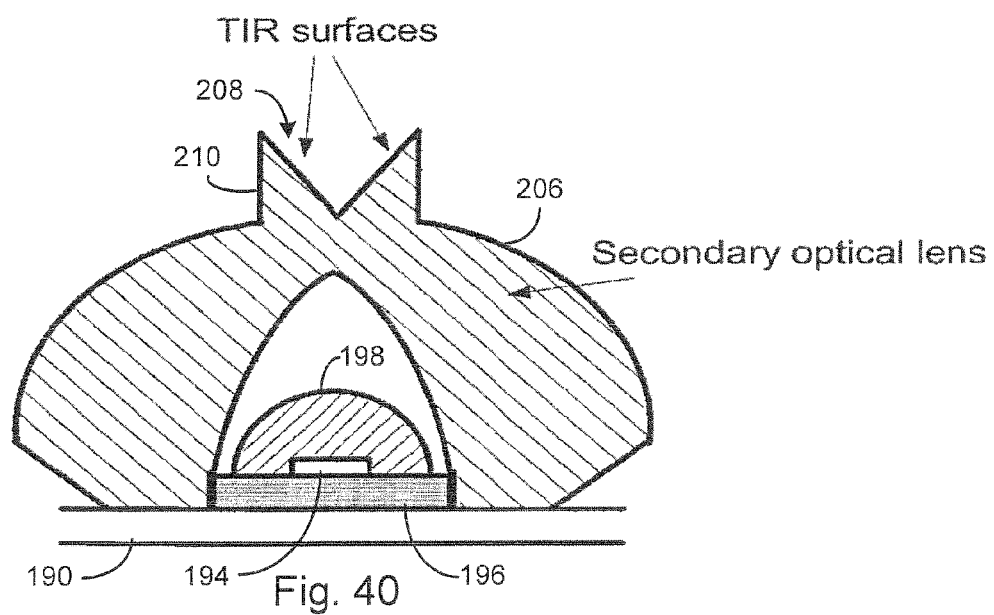
FIG. 40 is a cross-sectional view of an LED and a wide emitting lens in accordance with another embodiment of the invention.

FIG. 40 is a cross-sectional view of an LED 194 with a lens 206 that has a total internal reflection (TIR) portion 208. The TIR portion 208 is funnel-shaped. The TIR portion 208 causes most light emitted upward to be internally reflected and emitted through the side portions 210. Such a design is useful to reduce the intensity along the central axis while still providing a peak intensity within 50-80 degrees and an intensity along the central axis between 5-33% of the peak intensity. Any of the lens embodiments may be employed in the backlight of FIG. 33.

The secondary lenses in FIGS. 38 and 40 and in other figures may also be used over an LED die without a molded first lens. However, use with the molded first lens is preferable to protect the LED. The diameter of the secondary lens will typically range between 4-10 mm.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) structure comprising:
   an LED die having a center axis; and
   a lens fixed with respect to the LED die, the lens refracting light emitted by the LED die to cause a peak intensity to occur within 70-80 degrees off the center axis and an intensity along the center axis to be between 5% and 33% of the peak intensity,
   the lens comprising a first lens over the LED die and a secondary lens over the first lens, the secondary lens having a hollow portion forming a gap between the first lens and the secondary lens, the gap creating a refractive interface that bends light away from the center axis, the gap containing a medium that has an index of refraction lower than the index of refraction of material forming the first lens and the secondary lens.

2. The structure of claim 1 wherein light emitted from the LED structure has a brightness profile, the lens not creating any sharp intensity transitions around the center axis.

3. The structure of claim 1 wherein the intensity along the center axis is 5-15% of the peak intensity.

4. A light emitting diode (LED) structure comprising:
   an LED die having a center axis; and
   a lens fixed with respect to the LED die, the lens refracting light emitted by the LED die to cause a peak intensity to occur within 50-80 degrees off the center axis and an intensity along the center axis to be between 5% and 33% of the peak intensity,
   the lens comprising a first lens over the LED die and a secondary lens over the first lens, the secondary lens having a hollow portion forming a gap between the first lens and the secondary lens, the gap creating a refractive interface that bends light away from the center axis, the gap containing a medium that has an index of refraction lower than the index of refraction of material forming the first lens and the secondary lens,
   wherein the secondary lens comprises an aspherical outer surface and an aspherical dome shaped inner surface, the dome shaped inner surface being smooth and having a sharp peak at the central axis to reduce emissions along the center axis.

5. The structure of claim 1 wherein the secondary lens comprises an aspherical outer surface with a total internal reflection (TIR) portion for reducing light intensity near the center axis.

6. The structure of claim 1 wherein the gap contains air as the low index of refraction material.

7. The structure of claim 1 wherein the first lens is generally hemispherical.

8. The structure of claim 1 wherein the first lens is a lens molded directly over the LED die and encapsulates the LED die.

9. The structure of claim 1 wherein the gap is a dome shaped air gap.

10. The structure of claim 1 wherein the first lens is silicone and the secondary lens is plastic.

11. The structure of claim 1 further comprising:
    a submount on which the LED die is mounted;
    a printed circuit board on which the submount is mounted;
    wherein the secondary lens directly contacts the printed circuit board and surrounds the submount.

12. The structure of claim 1 further comprising:
    a submount on which the LED die is mounted;
    a printed circuit board on which the submount is mounted;
    wherein the first lens directly contacts the submount and surrounds the LED die.

13. The structure of claim 1 wherein the secondary lens has a pattern molded into its surface for affecting an emitted light pattern.

14. The structure of claim 13 wherein the pattern comprises a Fresnel lens, a diffraction grating, a binary pattern, pyramids, or cones.

15. The structure of claim 1 further comprising:
    a backlight incorporating the LED die; and
    a liquid crystal display panel for being illuminated by the backlight.

16. A light emitting diode (LED) structure comprising:
    an LED die having a center axis;
    a first lens encapsulating the LED die, wherein the first lens is a lens molded directly over the LED die; and
    a secondary lens surrounding the first lens and LED die, the secondary lens having a hollow portion forming a gap between the first lens and the secondary lens, the gap creating a refractive interface that bends light away from the center axis, the gap containing a medium that has an index of refraction lower than the index of refraction of material forming the first lens and the secondary lens,
    wherein the peak intensity output by the secondary lens occurs within 70-80 degrees off the center axis and the intensity along the center axis is 5-15% of the peak intensity.

17. The structure of claim 16 wherein the gap is dome shaped.

18. A light emitting diode (LED) structure comprising:
    an LED die;
    a submount on which the LED die is mounted;
    a printed circuit board on which the submount is mounted; and
    a lens fixed with respect to the LED die, the lens refracting light emitted by the LED die, wherein the lens directly contacts the printed circuit board and surrounds the submount,
    wherein the peak intensity output by the lens occurs within 70-80 degrees off the center axis and the intensity along the center axis is 5-15% of the peak intensity,
    wherein the lens is a secondary lens, the structure further comprising a first lens between the LED die and the secondary lens.

19. The structure of claim 18 wherein the first lens is generally hemispherical.

20. The structure of claim 18 wherein the first lens is a lens molded directly over the LED die and encapsulates the LED die.

21. The structure of claim 16 wherein the secondary lens has an aspherical outer surface with a total internal reflection (TIR) portion.

22. The structure of claim 16 wherein the secondary lens is made of silicone.

23. The structure of claim 16 wherein the secondary lens has a pattern molded into its surface for achieving the peak intensity output distribution.

24. The structure of claim 23 wherein pattern comprises a Fresnel lens, a diffraction grating, a binary pattern, pyramids, or cones.

25. The structure of claim 16 further comprising:
a submount on which the LED die is mounted;
a printed circuit board on which the submount is mounted;
wherein the secondary lens directly contacts the printed circuit board and surrounds the submount.

26. The structure of claim 16 further comprising:
a backlight incorporating the LED die; and
a liquid crystal display panel for being illuminated by the backlight.

27. The structure of claim 16 wherein the first lens is generally hemispherical.

28. The structure of claim 16 wherein the first lens is generally hemispherical and molded directly over the LED die, and wherein the secondary lens comprises an aspherical outer surface with a total internal reflection (TIR) portion.

29. The structure of claim 16 wherein the gap between the first lens and the secondary lens contains a low index of refraction material other than air.

30. The structure of claim 16 wherein the gap between the first lens and the secondary lens contains air.

31. The structure of claim 16 wherein the first lens comprises silicone, and the secondary lens comprises plastic.

32. The structure of claim 16 wherein the first lens and the secondary lens both comprise silicone.

* * * * *